(12) United States Patent
Jen et al.

(10) Patent No.: US 11,903,193 B2
(45) Date of Patent: Feb. 13, 2024

(54) TWO DIMENSIONAL STRUCTURE TO CONTROL FLASH OPERATION AND METHODS FOR FORMING THE SAME

(71) Applicant: Taiwan Semiconductor Manufacturing Company Limited, Hsinchu (TW)

(72) Inventors: Chi-Chung Jen, Kaohsiung (TW); Yu-Chu Lin, Tainan (TW); Y. C. Kuo, Kaohsiung (TW); Wen-Chih Chiang, Hsinchu (TW); Keng-Ying Liao, Tainan (TW); Huai-Jen Tung, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/863,749

(22) Filed: Jul. 13, 2022

(65) Prior Publication Data

US 2022/0352192 A1 Nov. 3, 2022

Related U.S. Application Data

(62) Division of application No. 17/000,613, filed on Aug. 24, 2020.

(51) Int. Cl.
*H01L 21/28* (2006.01)
*H10B 41/46* (2023.01)
(Continued)

(52) U.S. Cl.
CPC ........ *H10B 41/46* (2023.02); *H01L 29/40114* (2019.08); *H01L 29/42336* (2013.01); *H10B 41/30* (2023.02); *H01L 29/513* (2013.01)

(58) Field of Classification Search
CPC ........ H10B 41/30; H10B 41/46; H10B 43/30; H01L 29/51; H01L 29/423; H01L 29/513;
(Continued)

(56) References Cited

U.S. PATENT DOCUMENTS

| 5,429,970 A * | 7/1995 | Hong | H10B 41/30 |
| | | | 438/259 |
| 6,066,874 A * | 5/2000 | Lin | H01L 29/7885 |
| | | | 257/315 |

(Continued)

FOREIGN PATENT DOCUMENTS

| TW | 200405556 A | 4/2004 |
| TW | 202022924 A | 6/2020 |

OTHER PUBLICATIONS

Taiwan Patent and Trademark Office, Application No. 110105177 Office Action, dated Nov. 10, 2021, 6 pages.

*Primary Examiner* — Chuong A Luu
(74) *Attorney, Agent, or Firm* — The Marbury Law Group, PLLC

(57) ABSTRACT

A MOSFET device and method of making, the device including a floating gate layer formed within a trench in a substrate, a tunnel dielectric layer located on sidewalls and a bottom of the trench, a control gate dielectric layer located on a top surface of the floating gate layer, a control gate layer located on a top surface of the control gate dielectric layer and sidewall spacers located on sidewalls of the control gate dielectric layer and the control gate layer.

20 Claims, 17 Drawing Sheets

(51) Int. Cl.
*H01L 29/423* (2006.01)
*H10B 41/30* (2023.01)
*H01L 29/51* (2006.01)

(58) Field of Classification Search
CPC ......... H01L 29/40114; H01L 29/42336; H01L 21/28; H01L 21/2815; H01L 21/28132; H01L 21/8234; H01L 21/8238; H01L 21/823814; H01L 21/823864; H01L 21/823418; H01L 21/823425; H01L 21/823468
USPC ................ 438/266, 275, 276, 257, 259, 268
See application file for complete search history.

(56) References Cited

U.S. PATENT DOCUMENTS

| | | | |
|---|---|---|---|
| 6,127,226 A * | 10/2000 | Lin | H10B 41/30 438/270 |
| 2002/0110984 A1* | 8/2002 | Liou | H01L 29/42336 438/257 |
| 2003/0013250 A1 | 1/2003 | Koh | |
| 2005/0169041 A1 | 8/2005 | Wang | |
| 2005/0199914 A1 | 9/2005 | Chen et al. | |
| 2012/0080748 A1 | 4/2012 | Hsieh | |

* cited by examiner

TWO DIMENSIONAL STRUCTURE TO CONTROL FLASH OPERATION AND METHODS FOR FORMING THE SAME

RELATED APPLICATIONS

This application is a divisional application of U.S. application Ser. No. 17/000,613 entitled "Two-Dimensional Structure to Control Flash Operation and Methods for Forming the Same," filed on Aug. 24, 2020, the entire contents of which are incorporated herein by reference for all purposes.

BACKGROUND

Integrated circuit metal oxide semiconductor field effect transistor (MOSFET) memory devices, i.e. flash memory, typically include a memory region and a peripheral logic region. The memory region includes transistors, which have a floating gate layer and a tunnel dielectric layer located between the channel region and the top surface of the control gate layer. The transistors located in the peripheral logic region do not have a floating gate or a tunnel dielectric layer. Thus, the transistors in the memory region are typically taller than the transistors in the peripheral logic region. That is, the distance from the top surface of the substrate to the top surface of the control gate layer of the transistors in the memory region is larger than the distance from the top surface of the substrate to the top surface of the control gate layer in the peripheral logic region of the MOSFET device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
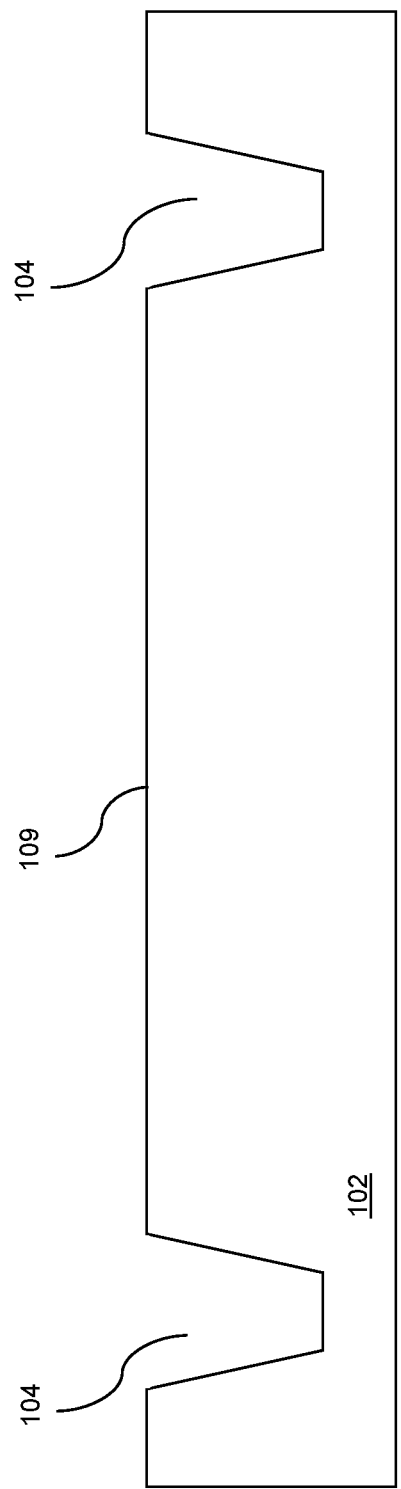
FIG. 1 is a vertical cross-sectional view illustrating a step of etching trenches in a substrate to form shallow trench isolation structures in the substrate in a method for fabricating a semiconductor device in accordance with various embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used to form metal-oxide semiconductor field effect transistor (MOSFET) semiconductor devices, e.g. integrated circuit MOSFET devices, in which at least some of the MOSFETs have floating gates formed within the substrate upon which the MOSFET is formed. As discussed above, transistors formed in a memory region have a floating gate layer and a tunnel dielectric layer located between the channel region that may be formed between active regions (i.e., source and drain regions) and the top surface of the control gate layer. Typically, the channel regions is formed in the substrate while the tunnel dielectric layer and the floating gate layer are formed over the top surface of the substrate. A control gate dielectric layer is typically formed over the floating gate layer and a control gate layer formed over the control gate dielectric layer. In contrast, transistors formed in the peripheral logic region do not include a floating gate layer. The addition of the floating gate layer and the tunnel dielectric layer may substantially increase the height of the memory transistor relative to a logic transistor. That is, the logic region has devices with one polysilicon layer (i.e. the control gate layer) while the memory region has devices with two polysilicon layers (i.e., the floating gate layer and the control gate layer). As a result, the transistors formed in the memory region are typically taller than the transistors formed in the peripheral logic region.

The difference in height between transistors formed in the memory region and the transistors formed in the peripheral logic region may adversely impact the ability to utilize a single photolithographic processes over both regions because the focal distance of photolithographic process varies between regions. Specifically, the difference in topography between the memory region and the peripheral logic region results in these regions having different focal points which may adversely affect photolithography processes. For example, when one of the memory region or peripheral logic region is in focus, the other region (memory of peripheral logic region) may be out of focus, resulting in an under etched region. Such under etching may result in undesired residue sticking to the surface of the out of focus region (i.e., memory of peripheral logic region). Alternatively, one of the memory of peripheral logic regions may be in focus, the other region (memory of peripheral logic region) may be out of focus, resulting in the out of focus region being over etched. Over etching may result in peeling of a polysilicon layer, especially, the top most polysilicon layer.

In order to mitigate the height difference between transistors formed in the memory region that include a floating gate layer and a tunnel dielectric layer, various embodiments disclosed herein form the floating gates and the tunnel dielectric layers of the transistors within the substrate. Consequently, the height of the transistors formed in the memory region with a floating gate layer and the tunnel dielectric layer may be approximately the same height as the transistors in the peripheral logic region that are formed without the floating gate and tunnel dielectric layers. In this manner, the focus of the lithographic radiation can be made essentially the same in the memory region and the peripheral logic region, thereby reducing or eliminating photolithographic damage that may have occurred due to different focal distances in the memory region and the peripheral logic regions.

Referring to FIG. 1, an exemplary structure according to an embodiment of the present disclosure is illustrated. The exemplary structure includes a substrate 102, which can be a semiconductor substrate such as a commercially available silicon substrate. Shallow trench isolation (STI) trenches 104 may be etched in substrate 102. To etch the STI trenches 104, a photoresist (not shown) may be deposited on a top surface 109 of the substrate 102 and patterned. Any suitable photoresist may be used, such as a positive or negative photoresist. Further, the substrate 102 may be etched with any suitable wet or dry etch or a combination of wet and dry etching. The substrate 102 may be made silicon, silicon on insulator (SOI), silicon on sapphire (SOS) or any other suitable material. The STI trenches 104 may have a depth in a range from 50 nm to 500 nm. For example, the STI trenches 104 may have a depth in a range of 75 nm to 400 nm, although greater or lesser depths are within the contemplated scope of disclosure.

Figure 2:
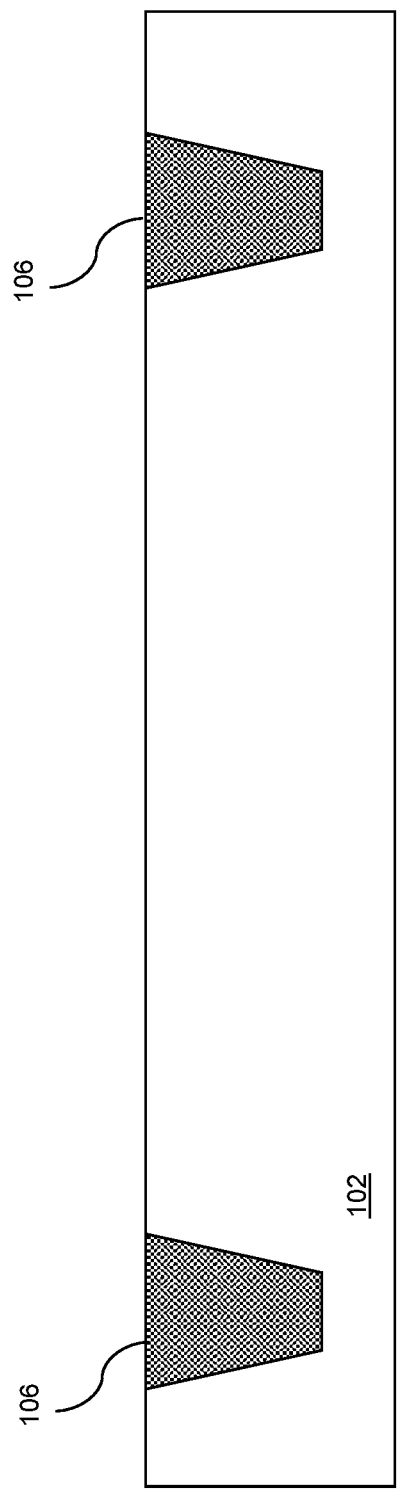
FIG. 2 is a vertical cross-sectional view illustrating a step of depositing an insulating material in the trenches in the substrate in a method for fabricating a semiconductor device in accordance with various embodiments of the disclosure.

Referring to FIG. 2, a STI dielectric material may be deposited into the STI trench 104 to form STI structures 106. The STI structures 106 provide electrical isolation between adjacent transistors. The STI structures 106 may be made of any suitable dielectric material, such as silicon oxide ($SiO_2$). The STI dielectric material may be deposited by chemical vapor deposition (CVD), plasma enhanced chemical vapor deposition (PECVD) or any other suitable deposition method.

Figure 3:
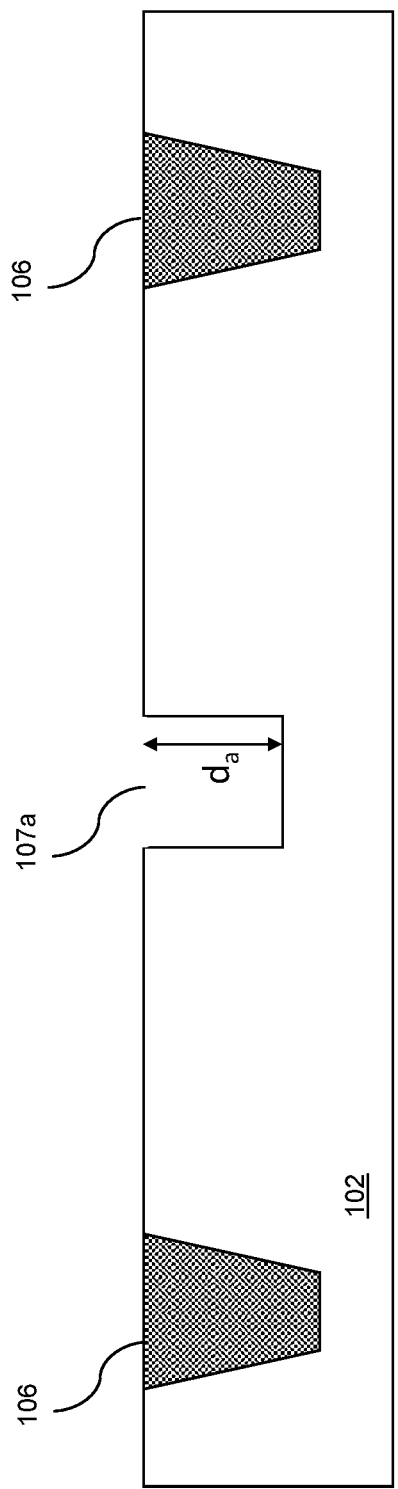
FIG. 3 is a vertical cross-sectional view illustrating a step of etching a memory trench in the substrate in a method for fabricating a semiconductor device in accordance with various embodiments of the disclosure.

Referring to FIG. 3, a first floating gate trench 107a may be formed in the substrate 102 between adjacent STI structures 106. The first floating gate trench 107a may be formed by first covering the substrate 102 and the STI structures 106 with a photoresist (not shown) and patterning the photoresist. The patterned photoresist then may be used as a mask to etch the substrate 102 to form the first floating gate trench 107a. Any suitable photoresist and etchants may be used. The photoresist and/or etchants may be the same as or different from the photoresist and/or etchants used to form the STI trenches 104. After forming the first floating gate trench 107a, the photoresist may be removed, such as by ashing, dissolving or grinding. Optionally, the photoresist layer may be left on the substrate 102 and removed after forming a first tunnel dielectric layer 108a and the first floating gate layer 110a (discussed in more detail below) such that excess tunnel dielectric layer material and floating gate material may be removed in a liftoff process. In various embodiments, the first floating gate trench 107a may have a depth da in a range of 50 nm to 400 nm, such as 75 nm to 300 nm. Trenches having a smaller or greater depth may also be formed as discussed in greater detail below.

Figure 4:
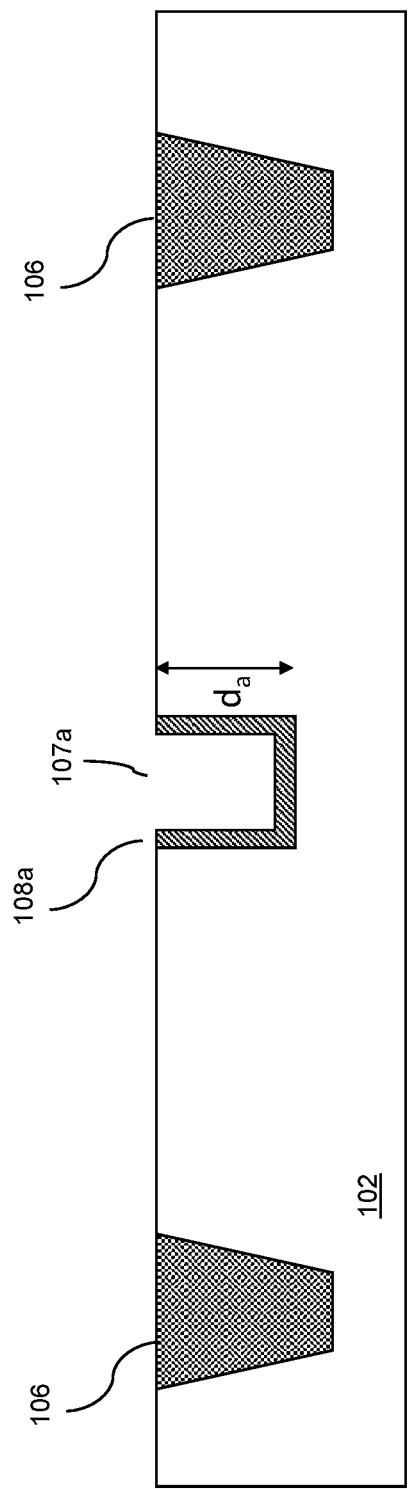
FIG. 4 is a vertical cross-sectional view illustrating a step of depositing a tunnel dielectric layer in the memory trench in the substrate in a method for fabricating a semiconductor device in accordance with various embodiments of the disclosure.

Referring to FIG. 4, a first tunnel dielectric layer 108a may be conformally deposited on the sidewalls of the first floating gate trench 107a. The first tunnel dielectric layer 108a may be made of $SiO_2$, $Si_3N_4$, $Al_2O_3$, $Y_2O_3$, $La_2O_3$, $Ta_2O_3$, $TiO_2$, $HfO_2$ or $ZrO_2$. Other suitable materials may be within the contemplated scope of disclosure. The first tunnel dielectric layer 108a may be deposited by CVD, PECVD, atomic layer deposition (ALD) or any other suitable method. The first tunnel dielectric layer 108a may have a thickness in the range of 1 nm to 15 nm, although greater or lesser thicknesses are within the contemplated scope of disclosure.

Figure 5:
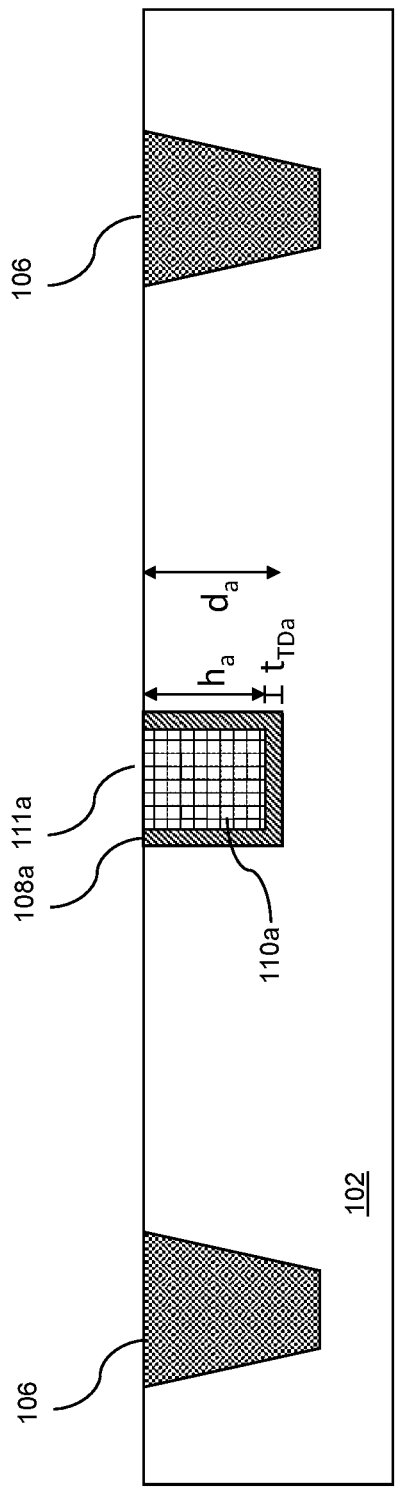
FIG. 5 is a vertical cross-sectional view illustrating a step of depositing a floating gate layer in the memory trench in a method for fabricating a semiconductor device in accordance with various embodiments of the disclosure.

Referring to FIG. 5, a first floating gate layer 110a may be formed in the first floating gate trench 107a. In an embodiment, the first floating gate trench 107a may be completely filled with the first tunnel dielectric layer 108a and the first floating gate layer 110a. Thus, the height ha of the first floating gate layer 110a and the thickness tTDa of the first tunnel dielectric layer 108a may be equal to the depth da of the first floating gate trench 107a. The first floating gate layer 110a may comprise polysilicon or any other suitable material and may be deposited by any suitable method, such as CVD, PECVD or ALD. Optionally, a planarizing step may be performed to remove any excess floating gate layer material. In this manner, a top surface 111a of the first floating gate layer 110a may be made coplanar with the top surface of the substrate 102. Planarizing may be performed by chemical mechanical polishing or by any other suitable method.

Figure 6:
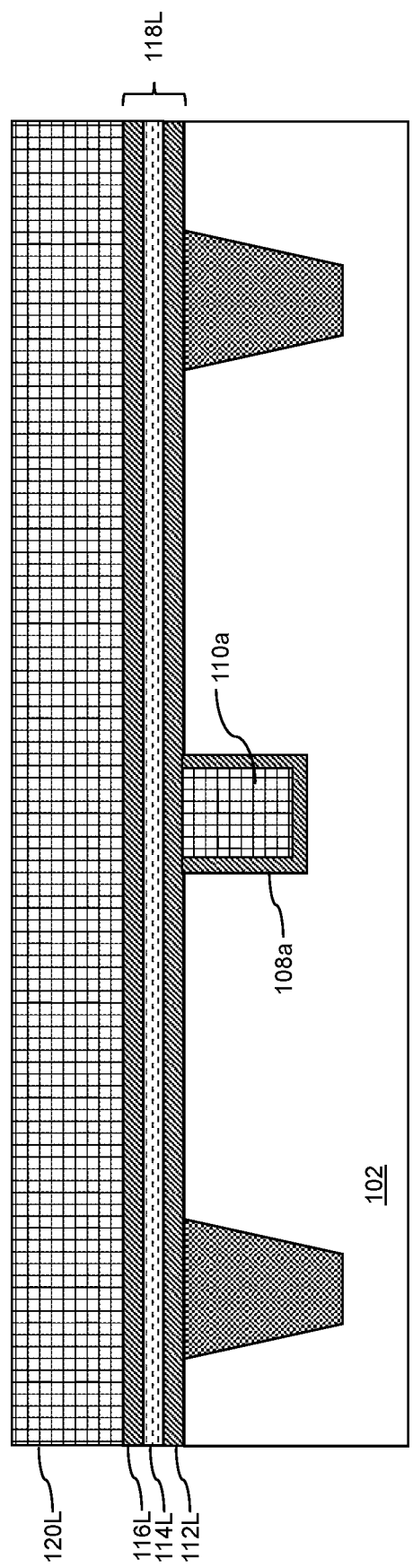
FIG. 6 is a vertical cross-sectional view illustrating a step of depositing a gate dielectric layer and a control gate layer over the substrate and the floating gate layer in a method for fabricating a semiconductor device in accordance with various embodiments of the disclosure.

Referring to FIG. 6, a continuous control gate dielectric layer 118L may be deposited over the substrate 102, first tunnel dielectric layer 108a and the first floating gate layer 110a as well as the STI structures 106. In an embodiment, the continuous control gate dielectric layer 118L may include a continuous first gate oxide layer 112L, a continuous nitride layer 114L over the continuous first gate oxide layer 112L and a continuous second gate oxide layer 116L over the continuous nitride layer 114L, thereby forming an oxide/nitride/oxide (ONO) sandwich layer. A continuous control gate layer 120L may then be deposited over the continuous second gate oxide layer 116L. The continuous control gate layer 120L may be made of poly silicon or any other suitable material. The continuous control gate dielectric layer 118L and the continuous control gate layer 120L may be deposited by any suitable method, such as CVD, PECVD and ALD.

Figure 7:
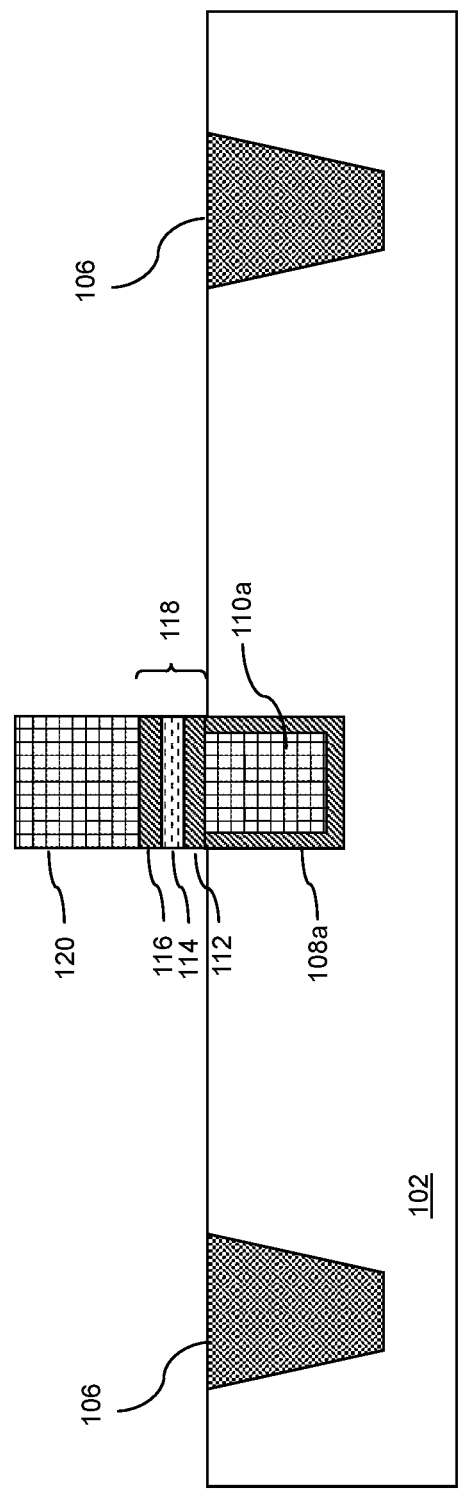
FIG. 7 is a vertical cross-sectional view illustrating a step of patterning the gate dielectric layer and the control gate layer in a method for fabricating a semiconductor device in accordance with some embodiments.

Referring to FIG. 7, the continuous control gate dielectric layer 118L and the continuous control gate layer 120L may be patterned. To pattern the continuous control gate dielectric layer 118L and the continuous control gate layer 120L, a photoresist (not shown) may be deposited on the top surface of the continuous control gate layer 120L and patterned. The continuous control gate dielectric layer 118L and the continuous control gate layer 120L may be patterned using the patterned photoresist as a mask. The result is a patterned control gate dielectric layer 118 and patterned control gate layer 120 both formed over the first floating gate layer 110a. In an embodiment, patterning of the continuous control gate dielectric layer 118L results in a patterned first gate oxide layer 112, a patterned nitride layer 114 over the patterned first gate oxide layer 112 and a patterned second gate oxide layer 116 over the patterned nitride layer 114.

Figure 8:
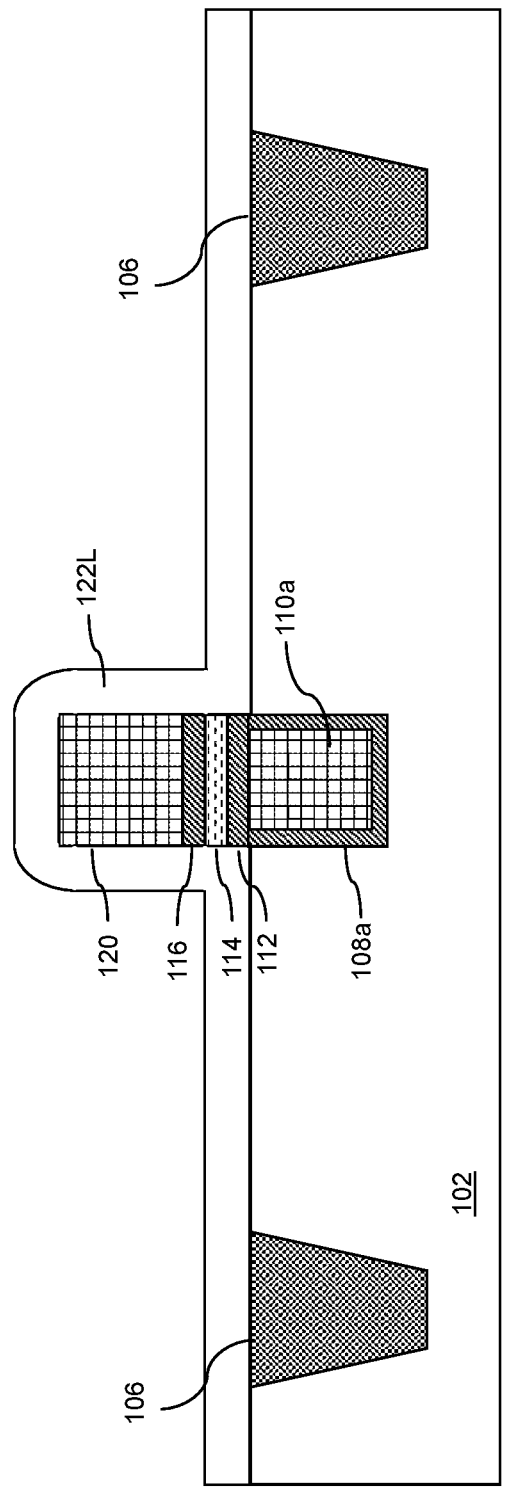
FIG. 8 is a vertical cross-sectional view illustrating a step of depositing a sidewall spacer dielectric layer over the substrate, the control gate dielectric layer and the control gate layer in a method for fabricating a semiconductor device in accordance with various embodiments of the disclosure.

Referring to FIG. 8, a continuous sidewall spacer layer 122L may be deposited over the surface of the substrate 102, the STI structures 106, the patterned control gate dielectric layer 118 and the patterned control gate layer 120. The continuous sidewall spacer layer 122L may be made of any suitable dielectric material, including but not limited to SiO2, or Si3N4. Other suitable materials are within the contemplated scope of disclosure. The continuous sidewall spacer layer 122L may be deposited by any suitable method such as CVD, PECVD or ALD. A planarizing step may be performed to remove any excess continuous sidewall spacer layer 122L material deposited over the patterned control gate layer 120. Planarizing may be performed by chemical mechanical polishing or by any other suitable method.

Figure 9:
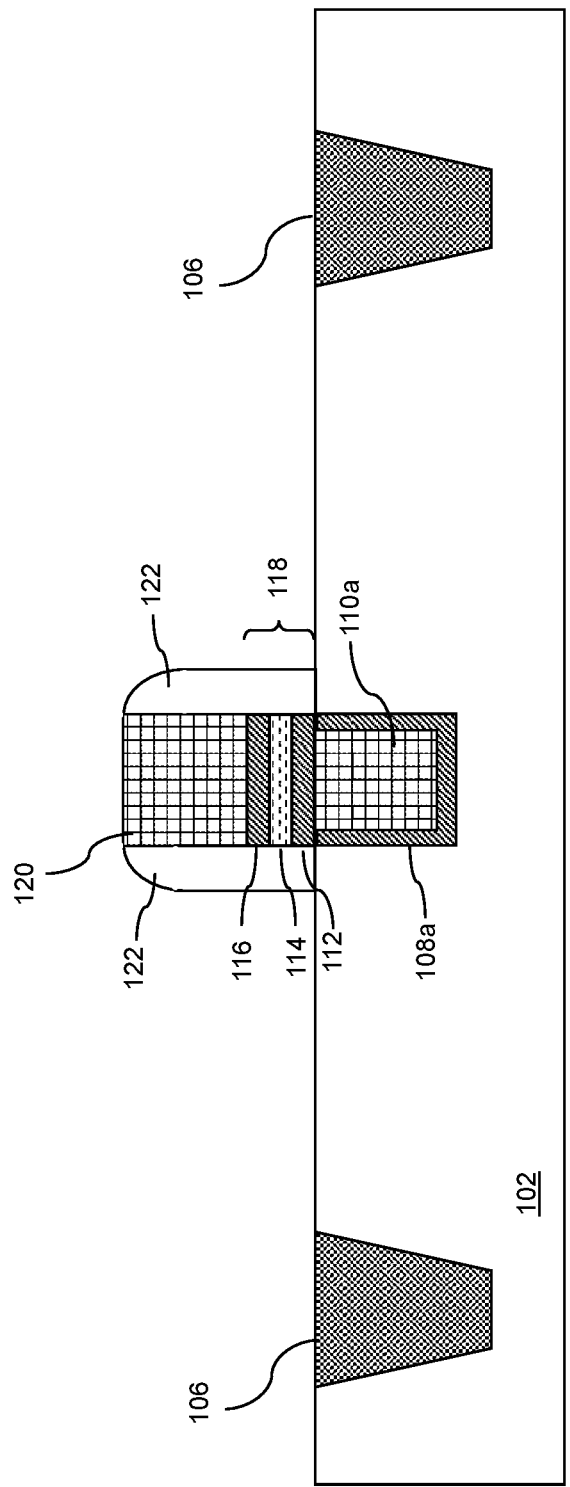
FIG. 9 is a vertical cross-sectional view illustrating a step of patterning the sidewall spacer dielectric layer in a method for fabricating a semiconductor device in accordance with various embodiments of the disclosure.

Referring to FIG. 9, the continuous sidewall spacer layer 122L may be patterned to form sidewall spacers 122 located on the sidewalls of the patterned control gate dielectric layer 118 and the patterned control gate layer 120. The continuous sidewall spacer layer 122L may be patterned with a photolithographic process. A photoresist layer (not shown) may be deposited over the continuous sidewall spacer layer 122L and patterned. The patterned photoresist may then be used as an etch mask to pattern the continuous sidewall spacer layer 122L to make the sidewall spacers 122. An etch process may be performed to remove the continuous sidewall spacer layer 122L covering the horizontal portions of the substrate and STI structures 106 such that dielectric spacers are formed on the sides of the patterned control gate dielectric layer 118 and the patterned control gate layer 120.

Figure 10:
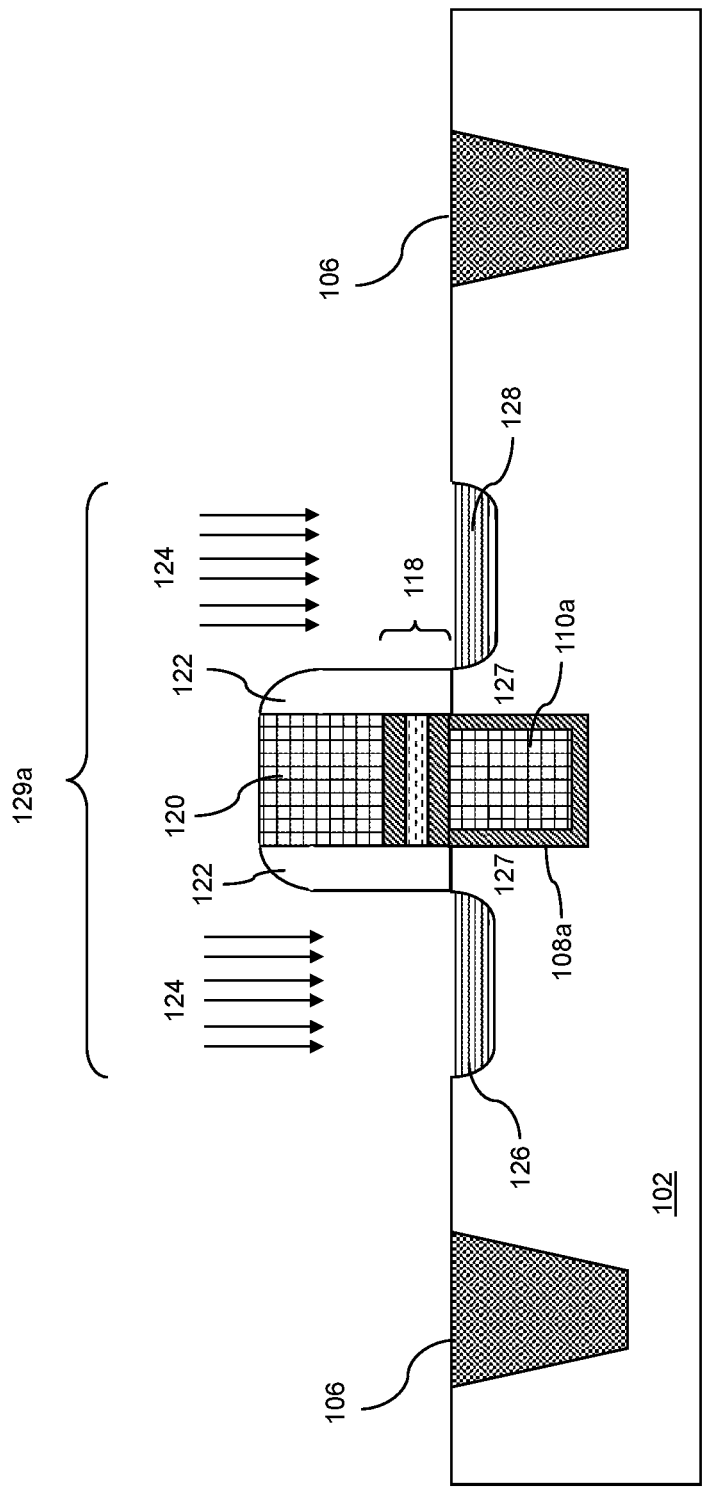
FIG. 10 is a vertical cross-sectional view illustrating a step of forming active regions in the substrate by ion implantation in a method for fabricating a semiconductor device in accordance with various embodiments of the disclosure.

Referring to FIG. 10, portions of the substrate 102 may be ion 124 implanted to form active regions 126, 128 (source and drain regions). The sidewall spacers 122 and the patterned control gate layer 120 may be used as a mask so that the active regions 126, 128 may be self-aligned with the patterned control gate layer 120. For example, the active regions 126, 128 may be doped either p-type or n-type as desired. Example n-type dopants include, but are not limited to, antimony, arsenic and phosphorous. Example p-type dopants include, but are not limited to boron, aluminum and gallium. The active regions 126, 128 may have an implanted ion concentration of $2 \times 10^{20}$ to $2 \times 10^{21}$. Greater or lesser doping concentrations may be used. Further, the active regions 126, 128 may have different dopant concentrations from each other. The active regions 126, 128, the channel region 127, the sidewall spacers 122 and the patterned control gate layer 120 over the patterned control gate dielectric layer 118 may form a first MOSFET device 129a. A channel region 127 may be formed between the active regions 126, 128 which typically is doped with the opposite dopant type than the active regions 126, 128. For example, if the active regions 126, 128 are p-type, then the channel is n-type. If the active regions 126, 128 are n-type, then the channel may be p-type. In various embodiments, the substrate may be doped prior to forming any other processing steps.

Figure 11:
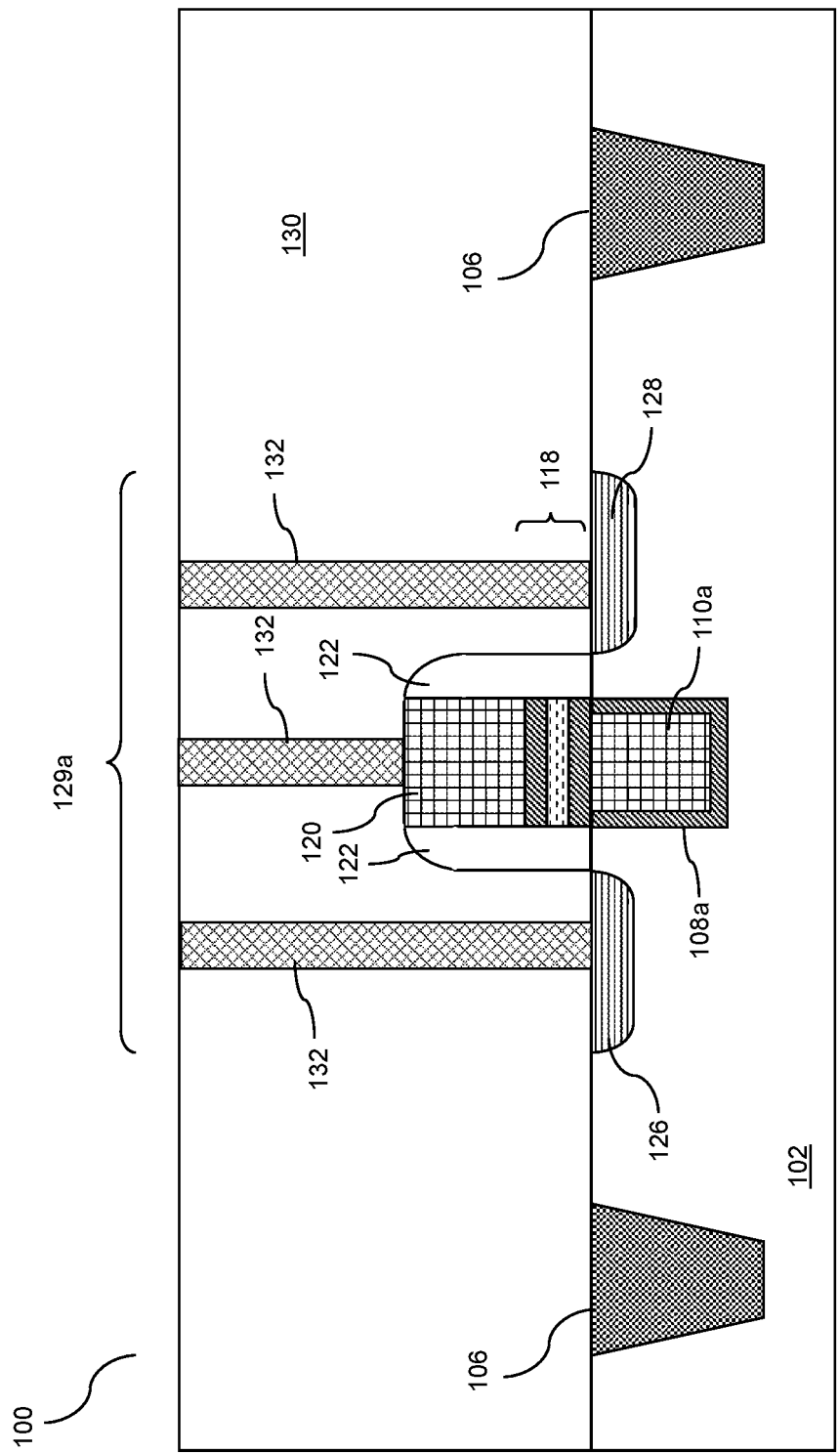
FIG. 11 is a vertical cross-sectional view illustrating a semiconductor device in accordance with various embodiments of the disclosure.

Referring to FIG. 11, an interconnect-level dielectric layer 130 may be deposited over the top surface of the substrate 102, the sidewall spacers 122 and the patterned control gate layer 120. Then, a photoresist layer (not shown) may be deposited and patterned to use as a mask to form via holes (not shown) in the interconnect-level dielectric layer 130. The via holes may be filled with metal, such as W, Cu, Co, Mo, Ru, other elemental metals, or an alloy or a combination thereof to form contact vias 132. Other suitable materials are within the contemplated scope of disclosure. In this manner, contact vias 132 coupled to the patterned control gate layer 120 and the active regions 126, 128 may be formed to complete the integrated circuit device 100. The result is an integrated circuit device 100 that includes first MOSFET devices 129a that include first floating gate layers 110a formed in the substrate 102. In an embodiment, the integrated circuit device 100 may be a dynamic random access memory (DRAM) or a static random access memory (SRAM).

Figure 12:
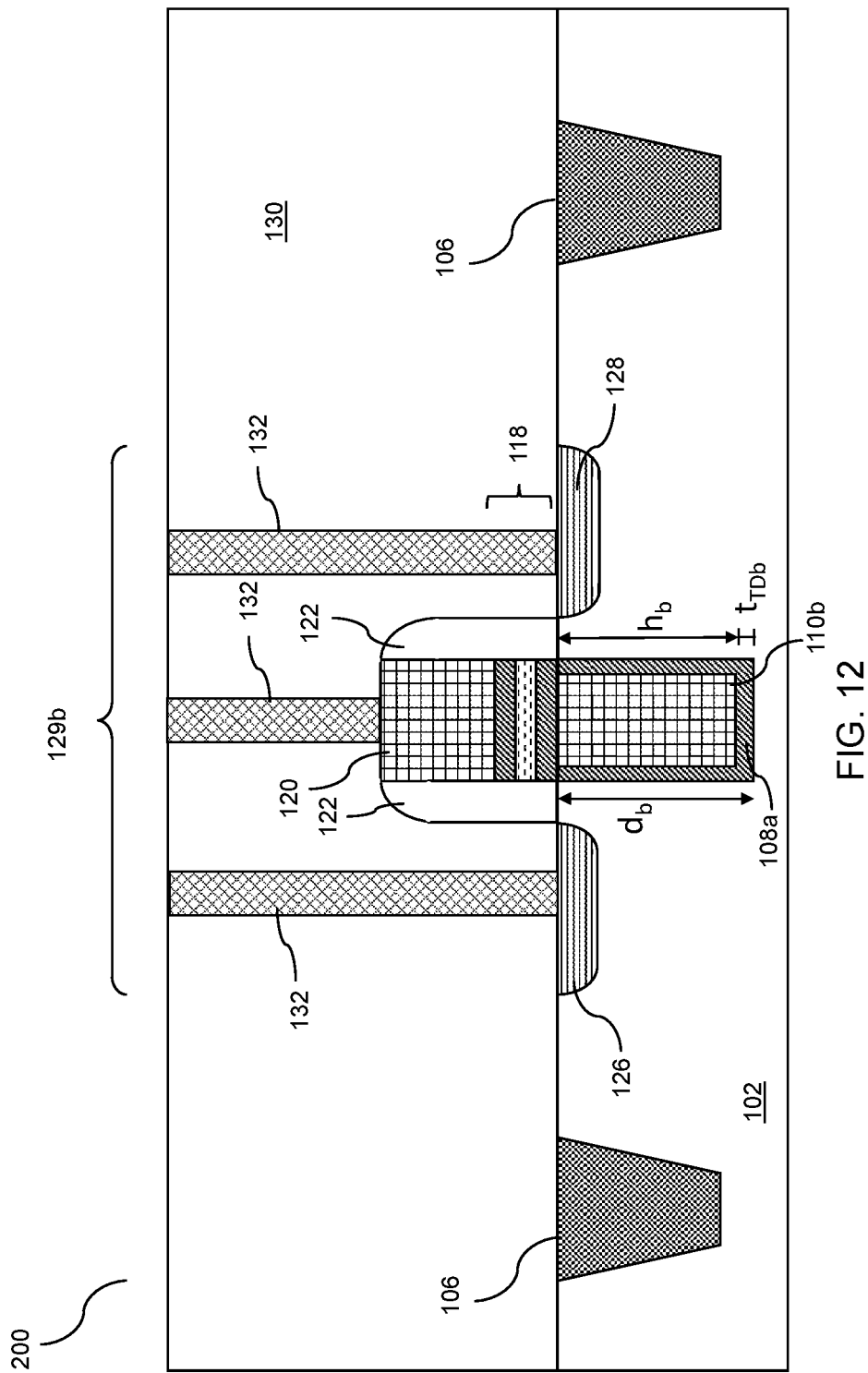
FIG. 12 is a vertical cross-sectional view illustrating another semiconductor device in accordance with various embodiments of the disclosure.

FIG. 12 illustrates another integrated circuit device 200 according to other embodiments of the disclosure. These embodiments are similar to the embodiment illustrated in FIG. 11. However, in these embodiments, a second floating gate trench 107b may be formed in the substrate 102 that is deeper than the first floating gate trench 107a discussed above. Specifically, the second floating gate trench 107b may a depth db of 100 nm to 600 nm, such as 150 nm to 500 nm, although greater or lesser trench depths are within the contemplated scope of disclosure.

A second tunnel dielectric layer 108b may be conformally deposited on the sidewalls of the second floating gate trench 107b. The second tunnel dielectric layer 108b may have a thickness tTDb that is the same as or different than the thickness tTDa of the first tunnel dielectric layer 108a. The second tunnel dielectric layer 108b may be made of SiO2, Si3N4, Al2O3, Y2O3, La2O3, Ta2O3, TiO2, HfO2 or ZrO2. Other suitable materials may be within the contemplated scope of disclosure. The second tunnel dielectric layer 108b may be deposited by CVD, PECVD, atomic layer deposition (ALD) or any other suitable method. The second tunnel dielectric layer 108b may have a thickness in the range of 1 nm to 15 nm, although greater or lesser thicknesses are within the contemplated scope of disclosure.

A second floating gate layer 110b may be formed in the second floating gate trench 107b. In an embodiment, the second floating gate trench 107b may be completely filled with the second tunnel dielectric layer 108b and the second floating gate layer 110b. Thus, the height hb of the second floating gate layer 110b and the thickness of the second tunnel dielectric layer 108b may be equal to the depth db of the second floating gate trench 107b. Because the height hb of the second floating gate layer 110b is larger than the height ha of the first floating gate layer 110a, the second floating gate layer 110b may have a larger volume that the first floating gate layer 110a for the same areal footprint. Because the second floating gate layer 110b may have a larger volume than the first floating gate layer 110a, the second floating gate layer 110b may hold more charge than the first floating gate layer 110a. Thus, the integrated circuit device 200 with the larger volume second floating gate layer 110b may be described as a higher capacity device. An integrated circuit device 100 with a smaller first floating gate layer 110a holds less charge than the integrated device 200 and can be discharged more quickly. Thus, the integrated circuit device 100 with the smaller first floating gate layer 110a can be described as a higher speed switching device.

The second floating gate layer 110b may comprise polysilicon or any other suitable material and may be deposited by any suitable method, such as CVD, PECVD or ALD. Optionally, a planarizing step may be performed to remove any excess floating gate layer material. In this manner, a top surface 111b of the second floating gate layer 110b may be made coplanar with the top surface of the substrate 102. Planarizing may be performed by chemical mechanical polishing or by any other suitable method.

In an embodiment, the patterned control gate dielectric layer 118 of the integrated circuit device 200 may be formed so that it is thicker than the patterned control gate dielectric layer 118 of the integrated circuit device 100. In an embodiment, the patterned control gate dielectric layer 118 of the integrated circuit device 200 as illustrated in FIG. 12 may comprises an ONO sandwich layer as discussed above with respect to FIGS. 6-11. The patterned first gate oxide layer 112 as illustrated in FIG. 12 may have a thickness that is 20-70% thicker than the patterned first gate oxide layer 112 in the integrated circuit device 100 as illustrated in FIGS. 6-11, although greater or lesser thicknesses are within the contemplated scope of disclosure. In an embodiment, the patterned first gate oxide layer 112 as illustrated in FIG. 12 may have a thickness that is 30-60% thicker than the patterned first gate oxide layer 112 in the integrated circuit device 100 as illustrated in FIGS. 6-11, although greater or lesser thicknesses are within the contemplated scope of disclosure. In an embodiment, the patterned first gate oxide layer 112 as illustrated in FIG. 12 may have a thickness that is 40-50% thicker than the patterned first gate oxide layer 112 in the integrated circuit device 100 as illustrated in FIGS. 6-11.

Figure 13:
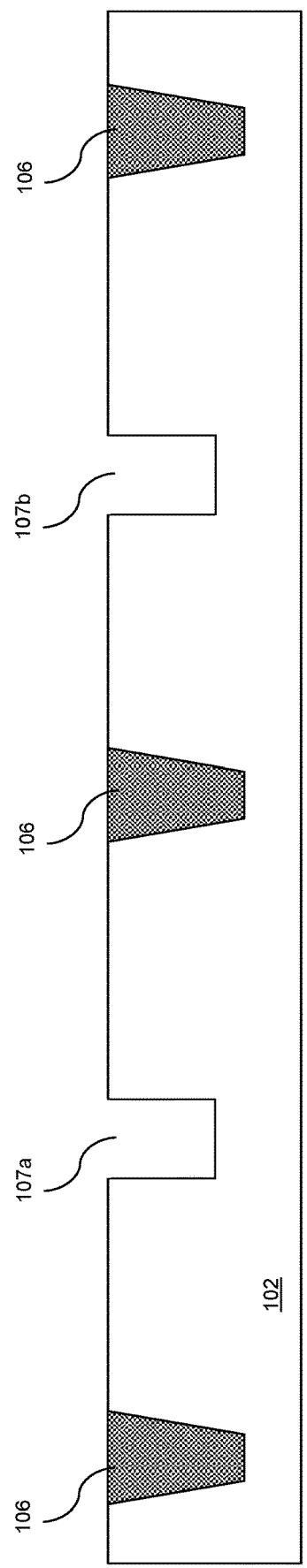
FIG. 13 is a vertical cross-sectional view illustrating a step of forming two memory trenches in another method for fabricating a semiconductor device in accordance with various embodiments of the disclosure.
Figure 14:
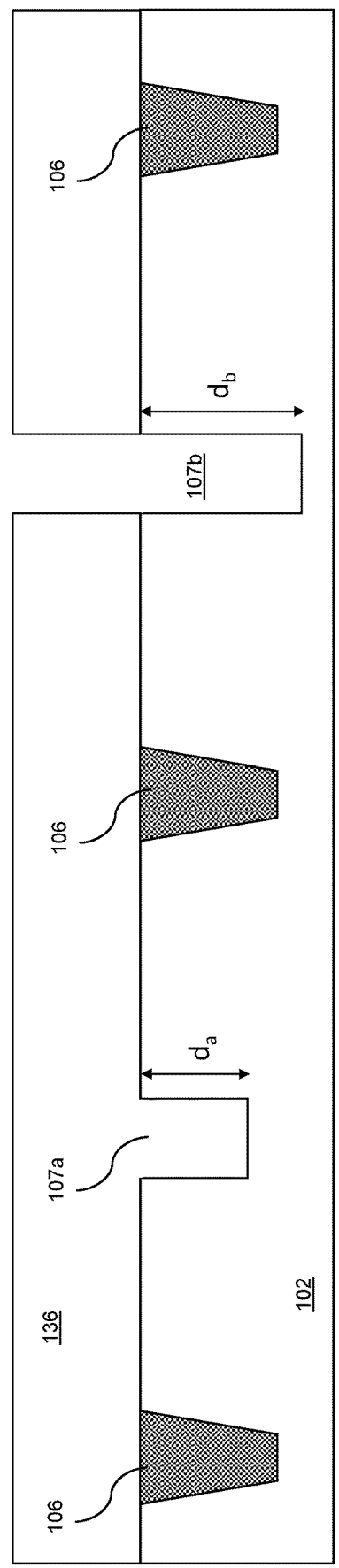
FIG. 14 is a vertical cross-sectional view illustrating a step of extending the depth of one of the memory trenches in the other method for fabricating a semiconductor device in accordance with various embodiments of the disclosure.
Figure 15:
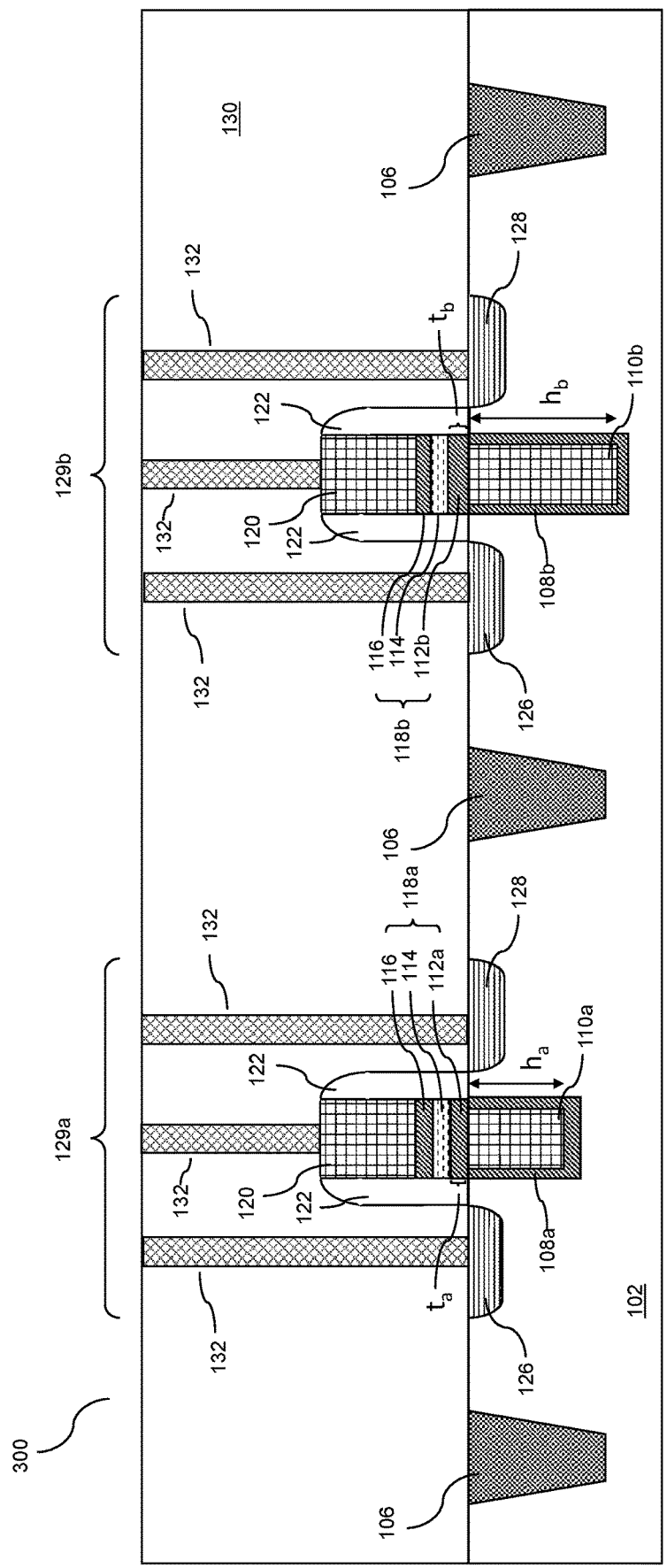
FIG. 15 is a vertical cross-sectional view illustrating another semiconductor device in accordance with various embodiments of the disclosure.

FIGS. 13-15 illustrate steps in a method of making integrated circuit device 300 according to another embodiment. Referring to FIG. 13, in a step similar to the step illustrated in FIG. 3, a first floating gate trench 107a and a second floating gate trench 107b may be formed in a substrate 102 with a STI structure 106 located between the first and second floating gate trenches 107a, 107b. In this step, both first and second floating gate trenches 107a, 107b have the same depth.

Referring to FIG. 14, a photoresist layer 136 may be deposited over the top surface 109 of the substrate 102. The photoresist layer 136 may fill the first and second floating gate trenches 107a, 107b. As illustrated in FIG. 14, the photoresist layer 136 may be patterned such that the photoresist layer 136 covers the first floating gate trench 107a and exposes the second floating gate trench 107b. The substrate 102 may then be further etched such that the depth of the second floating gate trench 107b in the substrate 102 is increased relative to the depth of the first floating gate trench 107a.

FIG. 15 illustrates an integrated circuit device 300 according to the present embodiment. The integrated circuit device 300 includes first MOSFET device 129a having a first floating gate layer 110a with a first height ha which can be described as higher speed and second transistor 129b having a second floating gate layer 110b with a second height hb which can be described as higher capacity. The first MOSFET device 129a includes a smaller first floating gate layer 110a due to the smaller height ha of the first floating gate layer 110a as compared to the second floating gate layer 110b of second height hb of the second transistor structure 129b.

The first and second patterned control gate dielectric layers 118a, 118b for the first and second transistor 129a, 129b may be formed by depositing continuous layers, such as a continuous first gate oxide layer 112L, continuous nitride layer 114L and continuous second gate oxide layer 116L spanning both the first and second transistor 129a, 129b and patterning as discussed above. In alternative embodiments, the patterned second gate oxide layer 112b of the second MOSFET device 129b may be thicker than the patterned first gate oxide layer 112a of the first MOSFET device 129a. In a method of forming the alternative embodiments, a continuous first gate oxide layer 112L having a first thickness may be deposited.

Processing continues as discussed above. Specifically, a photoresist may be deposited over the continuous first gate oxide layer 112L and patterned such that the continuous first gate oxide layer 112L in regions where the first transistor 129a are to be formed are masked and the continuous first gate oxide layer 112L in regions where the second transistor 129b are to be formed are exposed. Additional oxide material may be deposited such that the thickness of the exposed first gate oxide layer 112L increases. In this manner, the thickness of the continuous first gate oxide layer 112L for the second transistor 129b may be made thicker than the thickness of the continuous first gate oxide layer 112L for the first transistor 129a. The photoresist may then be removed and processing continued as discussed above. After patterning the continuous first gate oxide layer 112L, the continuous nitride layer 114L, the continuous second gate oxide layer 116L and the continuous control gate layer 120L, the result is an integrated circuit device 300 with a first transistor 129a having a patterned first gate oxide layer 112a with a thickness ta and second transistor 129b having a patterned second gate oxide layer 112b with a thickness tb. The thickness tb being thicker than the thickness ta. In an embodiment, the thickness tb of the second patterned gate oxide layer 112b may have a thickness that is 20-70% thicker than the thickness ta of the patterned first gate oxide layer 112a. In an embodiment, the thickness tb of the second patterned gate oxide layer 112b may have a thickness that is 30-60% thicker than the thickness ta of the patterned first gate oxide layer 112a. In an embodiment, the thickness tb of the second patterned gate oxide layer 112b may have a thickness that is 40-50% thicker than the thickness ta of the patterned first gate oxide layer 112a.

Figure 16:
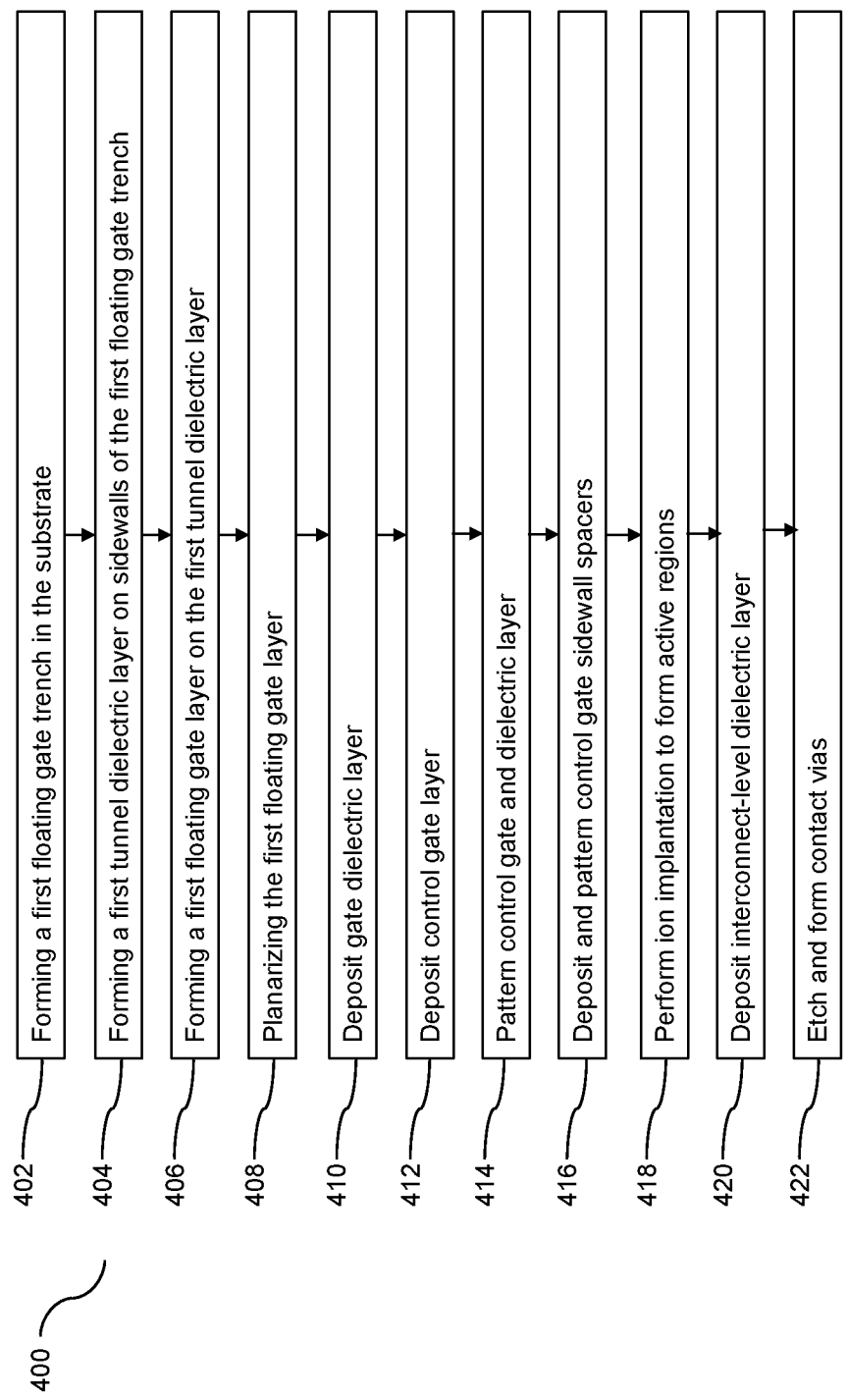
FIG. 16 is a flowchart illustrating a method of making a semiconductor device in accordance with various embodiments of the disclosure.

FIG. 16 is a flowchart illustrating general method 400 of making an integrated circuit device 100, 200 having a first floating gate layer 110a formed in a substrate 102. Referring to step 402, a first floating gate trench 107a may be formed in substrate 102 by patterning a photoresist layer over the substrate 102 and performing a subsequent etch process. As discussed above, the etch process may include any suitable wet or dry etch or a combination of wet and dry etching. Referring to step 404, a first tunnel dielectric layer 108a may be formed on sidewalls of the first floating gate trench 107a. The first tunnel dielectric layer 108a may be deposited by CVD, PECVD, atomic layer deposition (ALD) or any other suitable method. Referring to step 406, a first floating gate layer 110a may be formed on the first tunnel dielectric layer 108a. The first floating gate layer 110a may be deposited by any suitable method, such as CVD, PECVD or ALD. Referring to step 408, the first floating gate layer 110a may be planarized. The planarizing step 408 may be performed to remove any excess floating gate layer material. Planarizing may be performed by chemical mechanical polishing or by any other suitable method. To complete the integrated circuit device 100, 200, a continuous control gate dielectric layer 118L may be deposited over the substrate 102, the first tunnel dielectric layer 108a and the first floating gate layer 110a in step 410. The continuous control gate dielectric layer 118L may comprise a continuous first gate oxide layer 112L, a continuous nitride layer 114L and a continuous second gate oxide layer 116L. Next, in step 412, a continuous control gate layer 120L may be deposited over the continuous control gate dielectric layer 118L. In step 414, the continuous control gate dielectric layer 118L and the continuous control gate layer 120L may be patterned to form patterned control gate dielectric and patterned control gate layers 120. In step 416, a continuous sidewall spacer layer 122L may be deposited and patterned to form sidewall spacers 122 on the patterned control gate dielectric and patterned control gate layers 118, 120. The sidewall spacers 122 may be used as a mask in an ion implantation, step 418, to form active regions 126, 128 (source/drain regions) and complete the first MOSFET device 129a. Next, in step 420, an interconnect-level dielectric layer 130 may be deposited and contact vias to the active regions 126,128 and the patterned control gate layer 132 may be formed in step 422.

Figure 17:
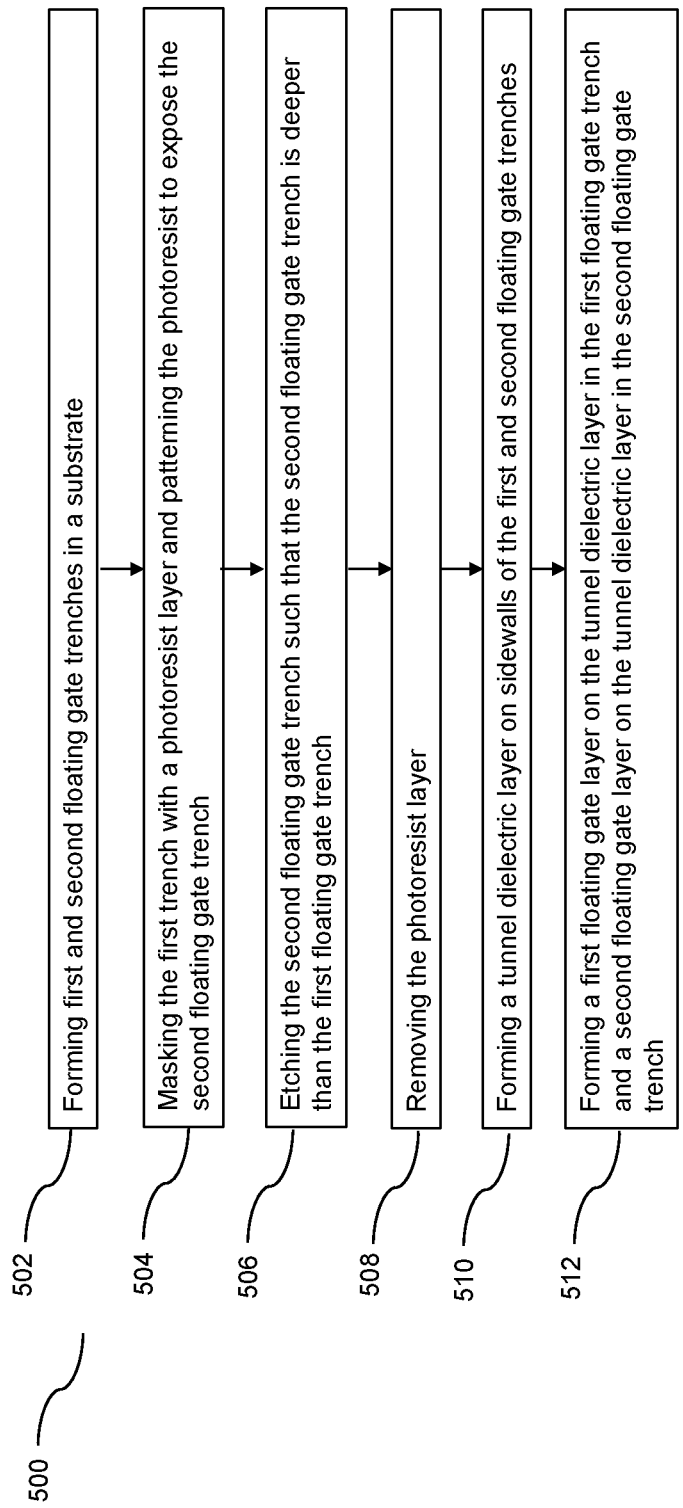
FIG. 17 is a flowchart illustrating another method of making a semiconductor device in accordance with various embodiments of the disclosure.

FIG. 17 is a flowchart illustrating a general method 500 of making an integrated circuit device 300 having higher speed and higher capacity first transistor 129a, 129b with first floating gate layers 110a embedded in a substrate 102. Referring to step 502, first and second floating gate trenches 107a, 107b may be etched in a substrate 102. Referring to step 504, the first floating gate trench 107a may be masked with a photoresist layer 136 and patterning the photoresist layer 136 to expose the second floating gate trench 107b. Referring to step 506, the second floating gate trench 107b may be etched such that the second floating gate trench 107b may be deeper than the first floating gate trench 107a. Referring to step 508, the photoresist layer 136 may be removed. Referring to step 510, a first tunnel dielectric layer 108a may be formed on sidewalls of the first and second floating gate trenches 107a, 107b. Referring to step 512, first floating gate layer 110a may be formed on the first tunnel dielectric layer 108a in the first floating gate trench 107a and a second floating gate layer 110b may be formed on the second tunnel dielectric layer 108b in the second floating gate trench 107b. After the formation of the floating gate layer on the tunnel dielectric layer as in step 512, the operations of steps 408-422 may be performed to complete the first and second MOSFET devices 129a and 129b.

Various embodiments of the present disclosure may provide a flash memory transistor structure with a first floating gate layer 110a buried within the substrate 102. By burying the first floating gate layer 110a within the substrate 102, the topography of the transistor formed in a memory region may be the same as the transistors formed in a peripheral logic region. By leveling the topography between transistors formed in a memory region with the transistors formed in a peripheral logic region, peeling defects due to defocus resulting from non-uniform heights between transistors in the memory region and transistors in the peripheral logic region may be mitigated. The uniform height allows for a uniform focal distance in subsequent photolithography operations. Conventional stacked polysilicon flash structures utilized i-line block process and poly guard rings to fix flash damage defect. The structures formed in the various embodiments disclosed herein may skip i-line block processes, thus improving efficiency and cost in fabrication. In addition, without the need for a poly guard ring, the resulting chip size may be reduced.

Referring to all drawings and according to various embodiments of the present disclosure, a MOSFET device including a first floating gate layer 110a formed within a first floating gate trench 107a in a substrate 102, a first tunnel dielectric layer 108a, 108b formed on sidewalls and a bottom of the first floating gate trench 107a, a patterned control gate dielectric layer 118 formed over on a top surface of the first floating gate layer 110a, a patterned control gate layer 120 located on a top surface of the control gate dielectric layer patterned and sidewall spacers 122 located on sidewalls of the patterned control gate dielectric layer 118 and the patterned control gate layer 120.

According to another embodiment of the present disclosure, an integrated circuit metal oxide semiconductor field effect transistor (MOSFET) device 100, 200, 300 may be provided on a substrate 102 including a plurality of MOSFET devices 129a or 129b in which at least one of the MOSFET devices 129a or 129b comprises a first floating gate layer 110a formed within a substrate 102.

Another embodiment is drawn to a method of making a MOSFET device 129a or 129b including etching a first floating gate trench 107a in the substrate 102, forming a first tunnel dielectric layer 108a, 108b on sidewalls of the first floating gate trench 107a, 107b, forming a first floating gate layer 110a in the first floating gate trench 107a, 107b on the first tunnel dielectric layer 108a, 108b, and planarizing the first floating gate layer 110a, 110b.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a MOSFET device, the method comprising:
   etching a first floating gate trench in a substrate;
   forming a first tunnel dielectric layer on sidewalls of the first floating gate trench;
   forming a first floating gate layer in the first floating gate trench on the first tunnel dielectric layer;
   planarizing the first floating gate layer, wherein a remaining portion of the first floating gate layer comprises a first floating gate electrode;
   forming a first control gate dielectric layer and a first control gate electrode over the first floating gate electrode;
   forming a first sidewall spacer on the first control gate dielectric layer and the first control gate electrode; and
   forming a source region and a drain region each in the substrate using the first sidewall spacer as a mask, wherein a channel region continuously extends between the source region and the drain region underneath the first floating gate trench, a first p-n junction between the channel region and the source region has a first top edge that is aligned to, and adjoined to, a bottom edge a first outer sidewall of the first sidewall spacer, and a second p-n junction between the channel region and the drain region has a second top edge that is aligned to, and adjoined to, a bottom edge a second outer sidewall of the first sidewall spacer.

2. The method of claim 1, further comprising:
   forming a first continuous control gate dielectric layer over the first floating gate;
   forming a continuous control gate layer over the first continuous control gate dielectric layer; and
   patterning the first continuous control gate dielectric layer and the continuous control gate layer, wherein patterned portions of the first continuous control gate dielectric layer and the continuous control gate layer comprise the first control gate dielectric layer and the first control gate electrode.

3. The method of claim 2, wherein forming the first continuous control gate dielectric layer comprises forming a continuous first oxide layer, forming a continuous nitride layer over the continuous first oxide layer and forming a continuous second oxide layer over the continuous nitride layer.

4. The method of claim 2, further comprising:
   etching a second floating gate trench in the substrate;
   forming a second tunnel dielectric layer on sidewalls of the second floating gate trench; and
   forming a second floating gate electrode on the second tunnel dielectric layer.

5. The method of claim 4, further comprising forming a second control gate dielectric layer and a second control gate electrode over the second tunnel dielectric layer and the second floating gate electrode.

6. The method of claim 5, wherein the second control gate electrode comprises a patterned oxide layer having a thickness which is 30-60% thicker than a thickness of the first control gate dielectric layer.

7. The method of claim 4, wherein
   the second tunnel dielectric layer is formed in the same step as the first tunnel dielectric layer.

8. The method of claim 1, wherein:
   the first top edge of the first p-n junction coincides with the bottom edge the first outer sidewall of the first sidewall spacer; and
   the second top edge of the second p-n junction coincides with the bottom edge of the second outer sidewall of the second sidewall spacer.

9. A method of making a MOSFET device, the method comprising:
   forming a first floating gate trench in a substrate;
   forming a first tunnel dielectric layer on sidewalls of the first floating gate trench;
   forming a first floating gate electrode in the first floating gate trench on the first tunnel dielectric layer;
   forming a continuous control gate dielectric layer over a top surface of the floating gate electrode;
   forming a control gate layer over a top surface of the control gate dielectric layer;
   patterning the control gate layer and the continuous control gate dielectric layer, wherein patterned portions of the control gate layer and the continuous control gate dielectric layer comprise a first control gate electrode and a first control gate dielectric layer;
   forming a first sidewall spacer on the first control gate dielectric layer and the first control gate electrode; and
   forming a source region and drain region within an upper portion of the substrate, wherein a channel region continuously extends between the source region and the drain region underneath the first floating gate trench, a first p-n junction between the channel region and the source region has a first top edge that is aligned to, and adjoined to, a bottom edge a first outer sidewall of the first sidewall spacer, and a second p-n junction between the channel region and the drain region has a second top edge that is aligned to, and adjoined to, a bottom edge a second outer sidewall of the first sidewall spacer, wherein the source region and the drain region are laterally spaced from, and do not directly contact, the tunnel dielectric layer.

10. The method of claim 9, wherein the source region and the drain region are formed at locations that are laterally spaced from the first control gate dielectric layer.

11. The method of claim 9, wherein a top surface of the first floating gate electrode is formed within a horizontal plane including a top surface of the substrate.

12. The method of claim 9, further comprising:
   forming an interconnect-level dielectric layer over the control gate electrode; and
   forming contact vias through the interconnect-level dielectric layer such that each of the contact vias is electrically coupled to a respective one of the source region, the drain region and the first control gate electrode.

13. A method of forming a semiconductor device, the method comprising:
   forming a first floating gate trench and a second floating gate trench in an upper portion of a substrate, wherein the first floating gate trench has a first depth and the second floating gate trench has a second depth that is different from the first depth;
   forming a first tunnel dielectric layer on a bottom surface of the first floating gate trench and a second tunnel dielectric layer on a bottom surface of the second floating gate trench;
   forming a first floating gate electrode in the first floating gate trench on the first tunnel dielectric layer and forming a second floating gate electrode in the second floating gate trench on the second tunnel dielectric layer;

forming a first control gate dielectric layer on the first floating gate electrode and forming a second control gate dielectric layer on the second floating gate electrode; and forming a first control gate electrode on the first control gate dielectric layer and forming a second control gate electrode on the second control gate dielectric layer.

14. The method of claim 13, further comprising forming a first source region and a first drain region within an upper portion of the substrate, wherein the first source region and the second source region are laterally spaced from, and do not directly contact, the first tunnel dielectric layer or the first control gate dielectric layer.

15. The method of claim 14, wherein the first floating gate electrode and the second floating gate electrode are formed by depositing a conductive material in the first floating gate trench and the second floating gate trench, and by performing a planarization process that removes portions of the conductive material from above a horizontal plane including a top surface of the substrate by performing a planarization process.

16. The method of claim 15, wherein:
an upper surface of the first floating gate electrode is substantially coplanar with the top surface of the substrate; and
an upper surface of the second floating gate electrode is substantially coplanar with the top surface of the substrate.

17. The method of claim 13, wherein:
the first control gate electrode is formed with a first control gate height;
the second control gate electrode is formed with a second control gate height; and
the second control gate height is substantially the same as the first control gate height.

18. The method of claim 13, wherein:
the first tunnel dielectric layer is formed on sidewalls of the first floating gate trench; and
the second tunnel dielectric layer is formed on sidewalls of the second floating gate trench.

19. The method of claim 13, wherein:
the first control gate dielectric layer is formed directly on a top surface of the first tunnel dielectric layer; and
the second control gate dielectric layer is formed directly on a top surface of the second tunnel dielectric layer.

20. The method of claim 13, further comprising:
forming a first sidewall spacer on the first control gate dielectric layer and the first control gate electrode; and
forming a source region and a drain region each in the substrate using the first sidewall spacer as a mask, wherein a channel region continuously extends between the source region and the drain region underneath the first floating gate trench, a first p-n junction between the channel region and the source region has a first top edge that is aligned to, and adjoined to, a bottom edge a first outer sidewall of the first sidewall spacer, and a second p-n junction between the channel region and the drain region has a second top edge that is aligned to, and adjoined to, a bottom edge a second outer sidewall of the first sidewall spacer.

* * * * *